(12) United States Patent
Kubo et al.

(10) Patent No.: US 11,597,196 B2
(45) Date of Patent: Mar. 7, 2023

(54) METHOD FOR PRODUCING THERMALLY CONDUCTIVE SHEET

(71) Applicant: DEXERIALS CORPORATION, Shimotsuke (JP)

(72) Inventors: Yusuke Kubo, Shimotsuke (JP); Keisuke Aramaki, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 112 days.

(21) Appl. No.: 17/424,596

(22) PCT Filed: Jan. 21, 2020

(86) PCT No.: PCT/JP2020/001907
§ 371 (c)(1),
(2) Date: Jul. 21, 2021

(87) PCT Pub. No.: WO2020/153346
PCT Pub. Date: Jul. 30, 2020

(65) Prior Publication Data
US 2022/0080718 A1    Mar. 17, 2022

(30) Foreign Application Priority Data

Jan. 25, 2019   (JP) .............................. JP2019-011143

(51) Int. Cl.
*B32B 37/18*    (2006.01)
*B32B 7/027*   (2019.01)
(Continued)

(52) U.S. Cl.
CPC ............ *B32B 37/182* (2013.01); *B29C 70/58* (2013.01); *B32B 7/027* (2019.01); *B32B 27/20* (2013.01);
(Continued)

(58) Field of Classification Search
CPC ............ B32B 2307/302; B32B 37/182; B29L 2007/002; B29K 2995/0013; B29K 2307/04; B29K 2083/00; B29C 70/58
See application file for complete search history.

(56) References Cited

FOREIGN PATENT DOCUMENTS

| CN | 108463882 A | 8/2018 |
|---|---|---|
| JP | 5752299 B2 | 7/2015 |

(Continued)

OTHER PUBLICATIONS

Machine translation of WO 2014/103327 (A1); Date: Jul. 3, 2017.*
International Search Report dated Apr. 14, 2020 in PCT/JP2020/001907 (with English translation), 4 pages.
International Preliminary Report on Patentability Chapter II dated May 11, 2021 in PCT/JP2020/001907 (with English translation), 8 pages.

(Continued)

*Primary Examiner* — Vishal I Patel
(74) *Attorney, Agent, or Firm* — Element IP, PLC

(57) ABSTRACT

A method for producing a thermally conductive sheet, includes forming a molded body sheet having thermal conductivity and comprising a fibrous thermally conductive filler. A silicone resin film is formed by applying a silicone resin to a supporting body. At least one surface of the molded body sheet is directly affixed to a silicone resin side of the silicone resin film. The silicone resin is transferred to the at least one surface of the molded body sheet to form a silicone resin layer on the molded body sheet. The silicone resin layer is to be attached to a heat source or a heat dissipating member. The molded body sheet has a change in thermal resistance due to the transferring of the silicone resin of 0.5° C.·cm$^2$/W or less.

9 Claims, 4 Drawing Sheets

(51) Int. Cl.
    *B29C 70/58*     (2006.01)
    *B32B 27/20*     (2006.01)
    *B32B 27/28*     (2006.01)
    *B29K 83/00*     (2006.01)
    *B29K 307/04*     (2006.01)
    *B29L 7/00*     (2006.01)
    *F28F 21/06*     (2006.01)
    *H01L 23/373*     (2006.01)

(52) U.S. Cl.
    CPC ........ *B32B 27/283* (2013.01); *B29K 2083/00* (2013.01); *B29K 2307/04* (2013.01); *B29K 2995/0013* (2013.01); *B29L 2007/002* (2013.01); *B32B 2262/106* (2013.01); *B32B 2307/302* (2013.01); *F28F 21/06* (2013.01); *F28F 2255/06* (2013.01); *H01L 23/3733* (2013.01)

(56) References Cited

FOREIGN PATENT DOCUMENTS

| | | |
|---|---|---|
| JP | 5766335 B2 | 8/2015 |
| JP | 2017092345 A | 5/2017 |
| WO | 2014103327 A1 | 7/2014 |

OTHER PUBLICATIONS

Combined Chinese Office Action and Search Report dated Oct. 8, 2022 in Patent Application No. 202080010270.4 (with partial English translation).

Office Action dated Jul. 12, 2022 in Japanese Patent Application No. 2019-011143 (with English translation), 6 pages.

Office Action dated Oct. 26, 2022 in Korean Patent Application No. 10-2021-7022898 (with English translation), 13 pages.

\* cited by examiner

METHOD FOR PRODUCING THERMALLY CONDUCTIVE SHEET

TECHNICAL FIELD

The present technology relates to a method for producing a thermally conductive sheet that is attached to an electronic component or the like to improve the heat dissipation thereof. This application claims priority on the basis of Japanese Patent Application No. 2019-011143 filed on Jan. 25, 2019 in Japan, which application is incorporated herein by reference.

BACKGROUND ART

As electronic devices become even more sophisticated, electronic components such as semiconductor devices are becoming increasingly dense and highly mounted. Accordingly, in order to more efficiently dissipate heat generated from electronic components constituting electronic devices, thermally conductive sheets are provided for use between various heat sources (for example, various devices such as LSIs, CPUs, transistors, LEDs, and the like) and heat dissipating members, such as heat sinks (for example, heat dissipating fans, heat dissipating plates, and the like).

A widely used thermally conductive sheet is formed by slicing a sheet from a cured product that is cured after molding a thermally conductive resin composition containing a thermally conductive filler such as an inorganic filler in a polymer matrix.

CITATION LIST

Patent Literature

Patent Literature 1: Japanese Patent No. 5766335
Patent Literature 2: Japanese Patent No. 5752299

SUMMARY OF THE INVENTION

Technical Problem

There is demand for such a thin thermally conductive sheet with high thermal conductivity to reduce the thermal resistance between various heat sources and heat-dissipating members. However, with the method for manufacturing a thermally conductive sheet by slicing the cured product of a thermally conductive resin composition, the surface of the thermally conductive sheet formed by slicing has no tackiness, while there is a case where tackiness (adhesiveness), such as adhering to an adherend, is required for the thermally conductive sheet from the perspective of handling.

Therefore, technology has been disclosed in which a thermally conductive sheet, obtained by preparing a thermally conductive resin composition by changing the ratio of silicone agent A and silicone agent B, is pressed, or placed between PET films and allowed to sit, thereby causing the components that do not contribute to the reaction to bleed out, enhancing the adhesion to an adherend (for example, Patent Literatures 1 and 2).

However, if the ratio of silicone A is increased, the sheet becomes highly flexible and easily adheres to the adherend, but there may be problems with peeling properties such as stretching or tearing of the thermally conductive sheet when the thermally conductive sheet is peeled from a release film. In addition, the flexibility of the thermally conductive sheet could cause long-term reliability problems due to creep in environments where a constant load is applied.

Therefore, an object of the present technology is to provide a manufacturing method of a thermally conductive sheet having tackiness on a surface of the sheet and improved handling properties.

Solution to Problem

In order to solve the aforementioned problem, the method for producing a thermally conductive sheet according to the present technology includes a step of forming a molded body sheet having thermal conductivity and containing a fibrous thermally conductive filler, and a step of affixing at least one surface of the molded body sheet to a silicone resin side of a silicone resin film obtained by laminating a silicone resin on a supporting body, and transferring the silicone resin layer to the molded body sheet, thereby laminating the silicone resin layer; wherein the molded body sheet has a change in thermal resistance due to the transferring of the silicone resin film of 0.5° C.·cm$^{-2}$/W or less.

Advantageous Effect of Invention

With the present technology, the thermally conductive sheet has tackiness due to the adhesive layer and favorable handling properties due to the silicone resin layer formed on the sheet body, and therefore, there is no problem with the properties of peeling from the release film due to bleeding of uncured components of the binder resin. In addition, the thermally conductive sheet with the present technology does not have a problem with long-term reliability caused by excessive flexibility.

DESCRIPTION OF EMBODIMENTS

Figure 1:
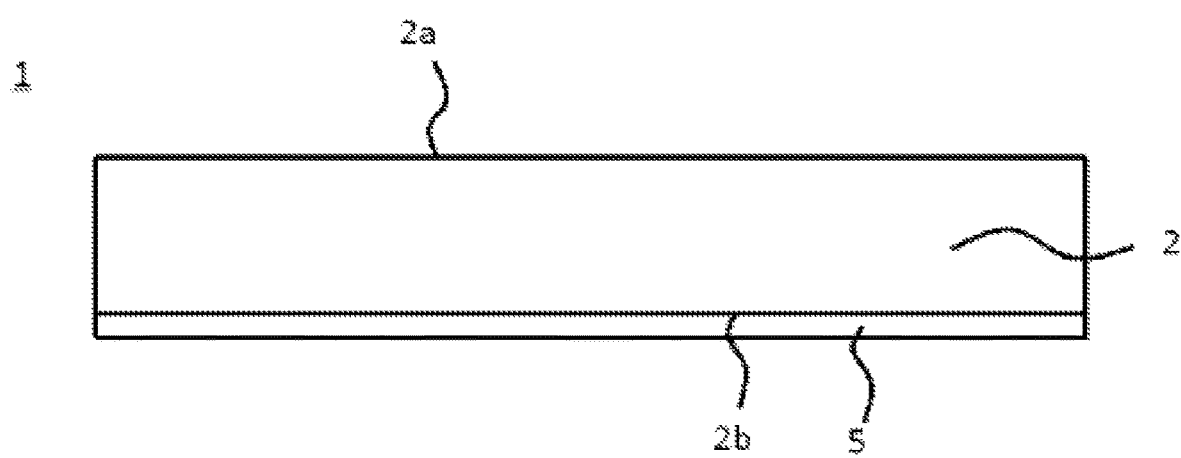
FIG. 1 is a cross-sectional view of an example of a thermally conductive sheet that applies the present technology.

The method for producing a thermally conductive sheet using the present technology is described below in detail while referring to the drawings. Note that the present technology is not limited only to the following embodiments, and of course, various alternatives are possible within the scope of the claims, without deviating from the gist of the present technology. The drawings are schematic, and the proportions of each dimension may differ from actual. Specific dimensions and the like should be determined with reference to the following descriptions. In addition, naturally, there are portions in which the relationships and proportions of the dimensions differ between the drawings.

The method for producing a thermally conductive sheet using the present technology includes a step of forming a molded body sheet having thermal conductivity and containing a fibrous thermally conductive filler (Step A), and a step of affixing at least one surface of the molded body sheet to a silicone resin side of a silicone resin film obtained by laminating a silicone resin on a supporting body, and transferring the silicone resin to the molded body sheet, thereby forming the silicone resin layer (Step B); wherein the molded body sheet has a change in thermal resistance due to the transfer of the silicone resin film of 0.5° C.·cm²/W or less.

The thermally conductive sheet manufactured by this technology has tackiness due to the silicone resin layer and favorable handling properties because the silicone resin layer is formed on the main body of the sheet, and therefore, there is no problem with the peeling property of the release film due to bleeding of uncured components of the polymer matrix component. In addition, the thermally conductive sheet with the present technology does not have a problem with long-term reliability caused by excessive flexibility. Furthermore, the thermally conductive sheet produced by the present technology can suppress an increase in thermal resistance and maintain thermal conductivity efficiency, even though a silicone resin layer that imparts tackiness is present.

The thickness of the silicone resin layer is preferably 12 µm or less when laminated to only one surface of the molded body sheet. When the silicone resin layer is laminated on both surfaces of the molded body sheet, the total thickness of the silicone resin layer on both surfaces should be 12 µm or less. On the other hand, if the thickness of the silicone resin layer laminated on only one surface of the molded body sheet or the total thickness of the silicone resin layers laminated on both surfaces of the molded body sheet exceeds 12 µm, the thermal resistance may increase and the thermal conductivity may deteriorate.

The thickness of the silicone resin layer laminated on only one surface of the molded body sheet or the total thickness of the silicone resin layers laminated on both surfaces of the molded body sheet is more preferably 2 µm or more in order to express sufficient tackiness.

The silicone resin layer is preferably transferred to a first surface of the molded body sheet, and a second surface of the molded body sheet is preferably non-adhesive. The thermally conductive sheet has adhesive properties on the first surface and non-adhesive properties on the second surface, which can improve handling and further suppress an increase in thermal resistivity.

The molded body sheet can be formed by a step of molding a thermally conductive resin composition containing a fibrous thermally conductive filler in a polymer matrix component into a predetermined shape, curing to form a thermally conductive molded body, and a step of slicing the thermally conductive molded body into a sheet shape.

With the thermally conductive sheet produced by the present technology, it is preferable that the polymer matrix component forming the molded body sheet is a liquid silicone component, and the thermally conductive filler is carbon fiber.

[Thermally Conductive Sheet]

FIG. 1 illustrates a thermally conductive sheet 1 manufactured by the present technology. The thermally conductive sheet 1 includes a sheet body 2 made by curing a polymer matrix component containing at least a fibrous thermally conductive filler, and a silicone resin layer 5 is formed on at least one surface of the sheet body 2.

The sheet body 2 has reduced or no tackiness (adhesiveness) on the front surface 2a and the back surface 2b. Herein, reduced or no tackiness means that the tackiness is reduced to an extent that a person does not feel tack when touching, thereby improving the handling and workability of the thermally conductive sheet 1. Note that with the thermally conductive sheet 1, some uncured components of the polymer matrix component may ooze out from the sheet body 2 and cover the thermally conductive filler exposed on the front and back surfaces 2a and 2b, but this does not cause the sheet body 2 to develop tackiness. As described below in detail, tackiness of the thermally conductive sheet 1 is achieved by a silicone resin layer 5 which is formed on the sheet body 2.

(Polymer Matrix Component)

The polymer matrix component that forms the sheet body 2 is a polymer component that serves as a base material for the thermally conductive sheet 1. The type of the polymer is not particularly limited, and any known polymer matrix component can be selected as appropriate. For example, one of the polymer matrix components can be a thermosetting polymer.

Examples of the thermosetting polymer include cross-linked rubber, epoxy resin, polyimide resin, bismaleimide resin, benzocyclobutene resin, phenol resin, unsaturated polyester, diallyl phthalate resin, silicone resin, polyurethane, polyimide silicone, thermosetting polyphenylene ether, thermosetting modified polyphenylene ether, and the like. These may be used individually, or two or more may be used in combination.

Note that the aforementioned cross-linked rubber includes, for example, natural rubber, butadiene rubber, isoprene rubber, nitrile rubber, hydrogenated nitrile rubber, chloroprene rubber, ethylene-propylene rubber, chlorinated polyethylene, chlorosulfonated polyethylene, butyl rubber, halogenated butyl rubber, fluoro rubber, urethane rubber, acrylic rubber, polyisobutylene rubber, silicone rubber, and the like. These may be used individually, or two or more may be used in combination.

Of these thermosetting polymers, a silicone resin is preferably used because of the excellent molding processability and weather resistance as well as close adhesiveness and following properties to electronic components. The silicone resin is not particularly limited, and the type of silicone resin can be selected based on the objective.

From the viewpoint of obtaining the molding processability, weather resistance, close adhesiveness, and the like, the silicone resin is preferably a silicone resin containing a liquid silicone gel as a main agent and a curing agent. Examples of the silicone resin include addition-reaction type liquid silicone resins and thermally vulcanized millable silicone resins using peroxides for vulcanizing, and the like. Of these, an addition-reaction type liquid silicone resin is particularly preferred for use as a heat-dissipating component in electronic equipment, because close adhesion is required between the heat-generating surface of the electronic component and the heat sink surface.

The addition-reaction type liquid silicone resin is preferably a two-component addition-reaction type silicone resin, such as a polyorganosiloxane having a vinyl group as the main agent and a polyorganosiloxane having a Si—H group as the curing agent.

Here, the liquid silicone component has a silicone A liquid component, which is the main agent, and a silicone B liquid component, which contains a curing agent, and the silicone A liquid component and the silicone B liquid component are blended in a predetermined ratio. The blending ratio of the silicone A liquid component and the silicone B liquid component can be adjusted as appropriate but is preferably set so as to provide flexibility to the sheet body 2 and to improve handling properties by providing non-tackiness to the surfaces of the sheet body 2 without excessive bleeding of uncured components of the polymer matrix component to the surfaces 2a, 2b of the sheet body 2 due to a pressing step.

Furthermore, the content of the polymer matrix component in the thermally conductive sheet 1 is not particularly limited and can be selected based on the objective, but from the viewpoint of ensuring the molding processability of the sheet and the close adhesiveness of the sheet, the amount is preferably approximately 15% to 50% by volume, more preferably 20% to 45% by volume.

(Fibrous Thermal Conductive Filler)

The fibrous thermally conductive filler contained in the thermally conductive sheet 1 is a component for improving the thermal conductivity of the sheet. The type of the thermally conductive filler is not particularly limited as long as being a fibrous material with high thermal conductivity, but carbon fiber is preferable for obtaining higher thermal conductivity.

Note that one type of thermally conductive filler may be used individually, or two or more types may be blended together. Furthermore, when two or more types of thermally conductive fillers are used, the fillers may all be fibrous thermally conductive fillers, or a mixture of fibrous thermally conductive fillers and other forms of thermally conductive filler may be used. Other forms of thermally conductive fillers include metals such as silver, copper, and aluminum, ceramics such as alumina, aluminum nitride, silicon carbide, and graphite, and the like.

There is no particular limitation on the type of carbon fiber, and the type can be appropriately selected based on the objective. Examples that can be used include pitch-based, PAN-based, and graphitized PBO fibers, as well as those synthesized by an arc discharge method, laser evaporation method, CVD method (chemical vapor deposition method), CCVD method (catalytic chemical vapor deposition method), and the like. Of these, graphitized PBO fibers and pitch-based carbon fibers are more preferable because of the high thermal conductivity.

The carbon fiber can be used after surface treatment of all or a portion if necessary. Examples of the surface treatment include oxidation treatment, nitriding treatment, nitration, sulfonation, and treatments in which a metal, metal compound, organic compound, or the like is attached or bonded to a functional group introduced to the surface by these treatments or to the surface of the carbon fiber. Examples of the functional group include hydroxyl groups, carboxyl groups, carbonyl groups, nitro groups, amino groups, and the like.

Furthermore, the average fiber length (average longer axis length) of the carbon fiber is not limited and can be appropriately selected, but from the viewpoint of ensuring high thermal conductivity, the range is preferably 50 μm to 300 μm, more preferably a range of 75 μm to 275 μm, and particularly preferably in a range of 90 μm to 250 μm.

Furthermore, there is no particular limitation to the average fiber diameter (average shorter axis length) of the carbon fibers, which may be selected as appropriate, but from the viewpoint of ensuring high thermal conductivity, the range is preferably 4 μm to 20 μm and more preferably a range of 5 μm to 14 μm.

The aspect ratio (average longer axis length/average shorter axis length) of the carbon fiber is preferably 8 or more and more preferably 9 to 30, from the viewpoint of ensuring high thermal conductivity. If the aspect ratio is less than 8, the thermal conductivity may decrease due to the short fiber length (longer axis length) of the carbon fibers, but if the aspect ratio is more than 30, the dispersibility of the carbon fibers in the thermally conductive sheet 1 may decrease, and thus sufficient thermal conductivity may not be obtained.

The average longer axis length and the average shorter axis length of the carbon fiber can be measured by, for example, a microscope, scanning electron microscope (SEM), or the like, and the average can be calculated from a plurality of samples.

The amount of fibrous thermally conductive filler in the thermally conductive sheet 1 is not particularly limited, and can be selected based on the objective, but is preferably from 4% to 40% by volume, more preferable from 5% to 35% by volume. If the amount is less than 4% by volume, obtaining sufficiently low thermal resistance will be difficult, but if the amount is more than 40% by volume, the formability of the thermally conductive sheet 1 and the alignment of the fibrous thermally conductive filler may be affected. Furthermore, the amount of the thermally conductive filler, including the fibrous thermally conductive filler, in the thermally conductive sheet 1 is preferably from 15% to 75% by volume.

The fibrous thermally conductive filler is exposed on the front and back surfaces 2a, 2b of the sheet body 2 and is in thermal contact with a heat source such as an electronic component or a heat dissipating member, such as a heat sink. If the fibrous thermally conductive filler exposed on the front and back surfaces 2a, 2b of the sheet body 2 is coated with uncured components of the polymer matrix component, the contact thermal resistance between the fibrous thermally conductive filler and the electronic component or the like can be reduced when the thermally conductive sheet 1 is applied to an electronic component or the like.

(Inorganic Filler)

The thermally conductive sheet 1 may further include an inorganic filler as a thermally conductive filler. The thermal conductivity of the thermally conductive sheet 1 can be further enhanced and the strength of the sheet can be improved by including an inorganic filler. The inorganic filler is not particularly limited for shape, material, average particle diameter, and the like and can be appropriately selected based on the objective. Example of the shape include spherical, ellipsoidal, lumpy, granular, flattened, needle-shape, and the like. Of these, spherical and elliptical shapes are preferable in terms of fill properties, and spherical shapes are particularly preferred.

Examples of the material of the inorganic filler include aluminum nitride (AlN), silica, alumina (aluminum oxide), boron nitride, titania, glass, zinc oxide, silicon carbide, silicon, silicon oxide, metal particles, and the like. These may be used individually, or two or more may be used in combination. Of these, alumina, boron nitride, aluminum nitride, zinc oxide and silica are preferable, and alumina and aluminum nitride are particularly preferable in terms of thermal conductivity.

Furthermore, the inorganic filler can be treated with a surface treatment. If the inorganic filler is treated with a coupling agent as the surface treatment, the dispersibility of the inorganic filler is improved and the flexibility of the thermally conductive sheet 1 is improved.

The average particle diameter of the inorganic filler can be selected based on the type of inorganic material and the like. If the inorganic filler is alumina, the average particle diameter is preferably 1 μm to 10 μm, more preferably 1 μm to 5 μm, and particularly preferably 4 μm to 5 μm. If the average particle diameter is less than 1 μm, the viscosity may increase and filler may become difficult to blend. On the other hand, if the average particle diameter exceeds 10 μm, the thermal resistance of the thermally conductive sheet 1 may increase.

Furthermore, if the inorganic filler is aluminum nitride, the average particle diameter is preferably 0.3 μm to 6.0 μm, more preferably 0.3 μm to 2.0 μm, and particularly preferably 0.5 μm to 1.5 μm. If the average particle diameter is less than 0.3 μm, the viscosity may increase and blending may be difficult, and if the diameter exceeds 6.0 μm, the thermal resistance of the thermally conductive sheet 1 may increase.

The average particle size of the inorganic filler can be measured by, for example, a particle size distribution meter and a scanning electron microscope (SEM).

(Other Components)

In addition to the polymer matrix component, the fibrous thermally conductive filler, and the optionally included of inorganic filler, the thermally conductive sheet 1 can also include other components as appropriate based on the objective. Examples of other components include magnetic metal powders, thixotropy imparting agents, dispersing agents, curing accelerators, retardants, minimal adhesiveness imparting agents, plasticizers, flame retardants, antioxidants, stabilizers, colorants, and the like. Furthermore, the thermally conductive sheet 1 may be provided with electromagnetic wave absorption capability by adjusting the amount of the magnetic metal powder.

[Silicone Resin Layer 5]

The silicone resin layer 5, which is transferred to at least one surface of the sheet body 2, imparts tackiness to at least one surface of the thermally conductive sheet 1. With the thermally conductive sheet 1 illustrated in FIG. 1, a silicone resin layer 5 is formed on the back surface 2b of the sheet body 2, and a silicone resin layer 5 is not formed on the front surface 2a. The front surface 2a of the sheet body 2 on which the silicone resin layer 5 is not formed is made to be non-adhesive to improve the handling properties.

The silicone resin can use a suitable silicone resin suitable as a polymer matrix component for forming the sheet body 2. In other words, the silicone resin that forms the silicone resin layer 5 can be an addition reaction type liquid silicone resin, a heat vulcanization type millable type silicone resin that uses a peroxide for vulcanization, and the like. Of these, an addition-reaction type liquid silicone resin is particularly preferred for use as a heat-dissipating component in electronic equipment, because it requires close adhesion between the heat-generating surface of the electronic component and the heat sink surface.

Furthermore, the addition-reaction type liquid silicone resin is preferably a two-component addition-reaction type silicone resin, such as a polyorganosiloxane having a vinyl group as the main agent and a polyorganosiloxane having a Si—H group as the curing agent.

Here, the liquid silicone component has a silicone A liquid component, which is the main agent, and a silicone B liquid component, which contains a curing agent, and the silicone A liquid component and the silicone B liquid component are blended in a predetermined ratio.

The sheet body 2 has a change in thermal resistance of 0.5° C.·cm$^2$/W or less due to transfer of the silicone resin film, and thereby the increase in thermal resistance can be suppressed and the thermal conduction efficiency can be maintained. Therefore, the silicone resin layer 5 preferably has a thickness of 12 μm or less. On the other hand, if the thickness of the silicone resin layer exceeds 12 μm, the thermal resistance may increase and the thermal conductivity may deteriorate. Furthermore, the silicone resin layer 5 preferably has a thickness of 2 μm or more in order to sufficiently develop tackiness on the sheet surface.

The silicone resin layer 5 is preferably transferred to the first surface of the sheet body 2, and the second surface of the sheet body 2 is preferably non-adhesive. The thermally conductive sheet has adhesive properties on the first surface and non-adhesive properties on the second surface, which can improve handling and further suppress an increase in thermal resistivity.

Note that the silicone resin layer 5 may be transferred to both surfaces of the sheet body 2. In this case, it is preferable that the total thickness of the silicone resin layers 5 laminated on both surfaces of the sheet body 2 be 12 μm or less. The method for forming the silicone resin layer 5 will be described below in detail.

[Method for Producing the Thermally Conductive Sheet]

Next, the manufacturing process of the thermally conductive sheet 1 is described. The manufacturing process of the thermally conductive sheet 1 using the present technology includes the step of forming a molded body sheet containing the fibrous thermally conductive filler and having thermally conductivity (Step A) and a step of affixing at least one surface of the molded body sheet to the silicone resin side of the silicone resin film obtained by laminating a silicone resin onto a supporting body, and transferring the silicone resin to the molded body sheet, thereby forming a silicone resin layer (Step B).

(Step A)

In Step A, a thermally conductive molded body sheet containing a fibrous thermally conductive filler is formed. The molded body sheet can be formed by: a step of molding a thermally conductive resin composition containing a fibrous thermally conductive filler in a polymer matrix component into a predetermined shape, and curing to form a thermally conductive molded body (Step A1); and a step of slicing the thermally conductive molded body into a sheet shape (Step A2).

In Step A1, the polymer matrix component, the fibrous thermally conductive filler, the optionally contained inorganic filler, and other components are blended to prepare a thermally conductive resin composition. Note that the procedure of blending and preparing each component is not particularly limited, and for example, the thermally conductive resin composition can be prepared by adding and blending the fibrous thermally conductive filler and optional inorganic filler, magnetic metal powder, and other components in the polymer matrix component.

Next, the fibrous thermally conductive filler, such as carbon fiber or the like, is oriented in one direction. The method of orientation of the filler is not particularly limited, so long as the method is means by which the filler can be oriented in one direction. For example, the fibrous thermally conductive filler can be relatively easily oriented in one direction, and the orientation of the fibrous thermally conductive filler is unified (within ±10°) by extruding or press-fitting the thermally conductive resin composition under high shear force into a hollow-shaped mold.

Specific examples of the method of extruding or press-fitting the thermally conductive resin composition into a hollow mold under high shear force can include an extrusion molding method or a die molding method. The thermally conductive resin composition flows and the fibrous thermally conductive filler is oriented in the direction of flow when the thermally conductive resin composition is extruded from the die with the extrusion molding method or when the thermally conductive resin composition is pressed into the mold with the die molding method. At this time, if a slit is provided on a tip of the die, the fibrous thermally conductive filler can be aligned more easily.

The thermally conductive resin composition extruded or pressed into a hollow mold is molded into a block shape based on the shape and size of the mold and is cured by curing the polymer matrix component while maintaining the orientation of the fibrous thermally conductive filler, thereby forming a thermally conductive molded body. The thermally conductive molded body refers to a base material (molded body) for cutting out a sheet, which is the source of the thermally conductive sheet 1 obtained by cutting to a predetermined size.

The size and shape of the hollow mold and the thermally conductive molded body can be determined based on the target size and shape of the thermally conductive sheet 1, for example, a rectangular solid having a cross-sectional vertical size of 0.5 cm to 15 cm and a cross-sectional horizontal size of 0.5 cm to 15 cm. The length of the rectangular solid can be determined as needed.

The method and conditions for curing the polymer matrix component can be varied depending on the type of the polymer matrix component. For example, if the polymer matrix component is a thermosetting resin, the curing temperature for thermosetting can be adjusted. Furthermore, if the thermosetting resin contains a liquid silicone gel as a main agent and a curing agent, the resin is preferably cured at a curing temperature of 80° C. to 120° C. The curing time during thermal curing is not particularly limited, but can be from 1 hour to 10 hours.

Figure 2:
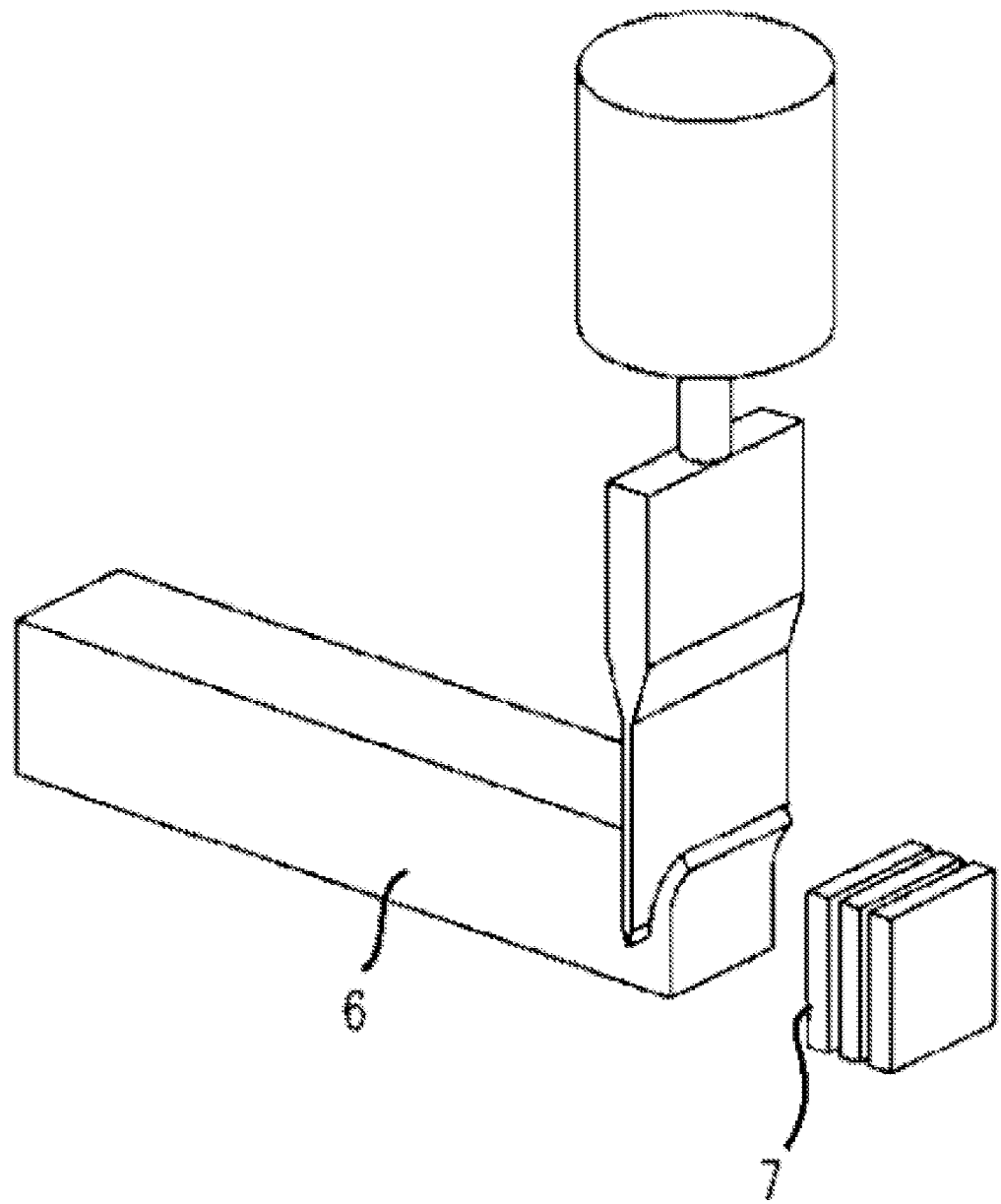
FIG. 2 is a perspective view illustrating an example of a process of slicing a thermally conductive molded body.

In Step A2, as illustrated in FIG. 2, the thermally conductive molded body 6 is sliced into a sheet form to make a molded body sheet 7. During step A2, the thermally conductive molded body 6 is cut into a sheet shape at an angle of 0° to 90° with respect to the longer axis direction of the oriented fibrous thermally conductive filler. As a result, the fibrous thermally conductive filler is oriented in the thickness direction of the sheet body 2.

Furthermore, cutting of the thermally conductive molded body 6 is performed using a slicing device. The slicing device is not particularly limited so long as being means capable of cutting the thermally conductive molded body 6, and any known slicing device can be used as appropriate. For example, an ultrasonic cutter, plane, or the like can be used.

The slice thickness of the thermally conductive molded body 6 is the thickness of the sheet body 2 of the thermally conductive sheet 1 and can be set as appropriate based on the application of the thermally conductive sheet 1 and, for example, is 0.5 to 3.0 mm.

Note that in Step A2, a plurality of small pieces of the molded body sheet 7 can be made by cutting molded body sheets 7 which were cut from the thermally conductive molded body 6.

Furthermore, the Step A may also, if necessary, include a step of smoothing the surface of the sheet body 2 by pressing the formed sheet 7 (Step A3) after Step A2 and before Step B. In Step A3, a release film is applied to both surfaces of the molded body sheet 7 and pressed to smooth the sheet surface and to coat the fibrous thermally conductive filler exposed on the sheet surface by the uncured components of the polymer matrix component. As a result, with the thermally conductive sheet 1, the unevenness of the sheet surface is reduced, the silicone resin layer 5 can be uniformly transferred in Step B, the close adhesiveness between the heat source and the heat-dissipating member can be enhanced, the interfacial contact resistance under a light load can be reduced, and the thermal conduction efficiency can be enhanced.

The pressing can be performed, for example, by a set of pressing devices including a flat plate and a press head with a flat surface. Furthermore, a pinch roller may also be used to perform pressing.

The pressure during pressing is not particularly limited but can be selected as appropriate based on the objective, but if the pressure is too low, the thermal resistance tends to be the same as without pressing and if the pressure is too high, the sheet tends to be stretched, and therefore, a pressure range of 0.1 MPa to 100 MPa is preferable, and a pressure range of 0.5 MPa to 95 MPa is more preferable.

Note that an example of the release film affixed to both surfaces of the molded body sheet 7 is a PET film. Furthermore, the release film may be treated with a release treatment on the surface to which the surface of the molded body sheet 7 is applied. The release film is peeled from the molded body sheet 7 which is then provided to Step B for forming the silicone resin layer 5.

(Step B)

Figure 3:
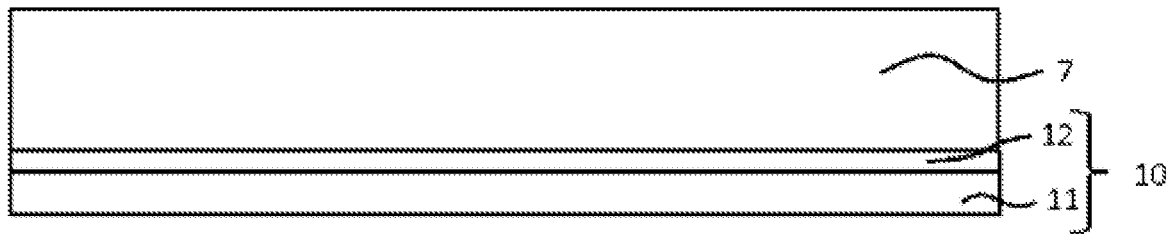
FIG. 3 is a cross-sectional view illustrating the step of transferring silicone resin to one surface of a molded body sheet.

In Step B, as illustrated in FIG. 3, at least one surface of the molded body sheet 7 is affixed to the silicone resin 12 side of the silicone resin film 10 obtained by laminating the silicone resin 12 onto the supporting body 11, and the silicone resin 12 is transferred to the molded body sheet 7 to form a silicone resin layer.

The supporting body 11 supporting the silicone resin 12 is a plastic film, for example a PET film. Furthermore, the supporting body 11 may have a release treatment applied to the surface on which the silicone resin 12 is to be laminated.

The silicone resin film 10 can be formed by coating the supporting body 11 with a silicone resin, such as the aforementioned two-component addition-reaction silicone resin. The silicone resin 12 is preferably laminated on the supporting body 11 at a thickness of 12 µm or less by controlling the dispensing amount of the dispenser, the transport speed of the supporting body 11, and the like. Thereby, the molded body sheet 7 has a change in thermal resistance of 0.5° C.·cm²/W or less due to transfer of the silicone resin film 10, and thereby the increase in thermal resistance can be suppressed and the thermal conduction efficiency can be maintained. Furthermore, the silicone resin 12 is preferably laminated to a thickness of 2 µm or more in order to sufficiently express tackiness on the surface of the molded body sheet 7.

Furthermore, the silicone resin film 10 is applied to the surface of the molded body sheet 7 that is coated with silicone resin, as illustrated in FIG. 3, to form a film laminate body. Next, a release film is affixed to both surfaces of the film laminate body, and then the film is heated and pressed under predetermined heating and pressure conditions (for examples, pressure: 0.5 MPa, temperature: 87° C., time: 3 minutes). The result is the formation of a thermally conductive sheet having a silicone resin film where silicone resin is transferred and attached to the molded body sheet 7. A thermally conductive sheet 1 having a silicone resin layer 5 laminated on the sheet body 2 is obtained by peeling off the release film and the supporting body 11.

[Usage Pattern Example]

In actual use, the thermally conductive sheet 1 is attached, for example, to electronic components such as a semiconductor device or the inside of various electronic devices. At this time, the thermally conductive sheet 1 has excellent handling properties because the tackiness is reduced or lost on the surface of the sheet body 2 or the sheet is adhered to the supporting body 11, but the sheet also has tackiness because the silicone resin layer 5 is transferred and attached to one surface, so workability is excellent.

Figure 4:
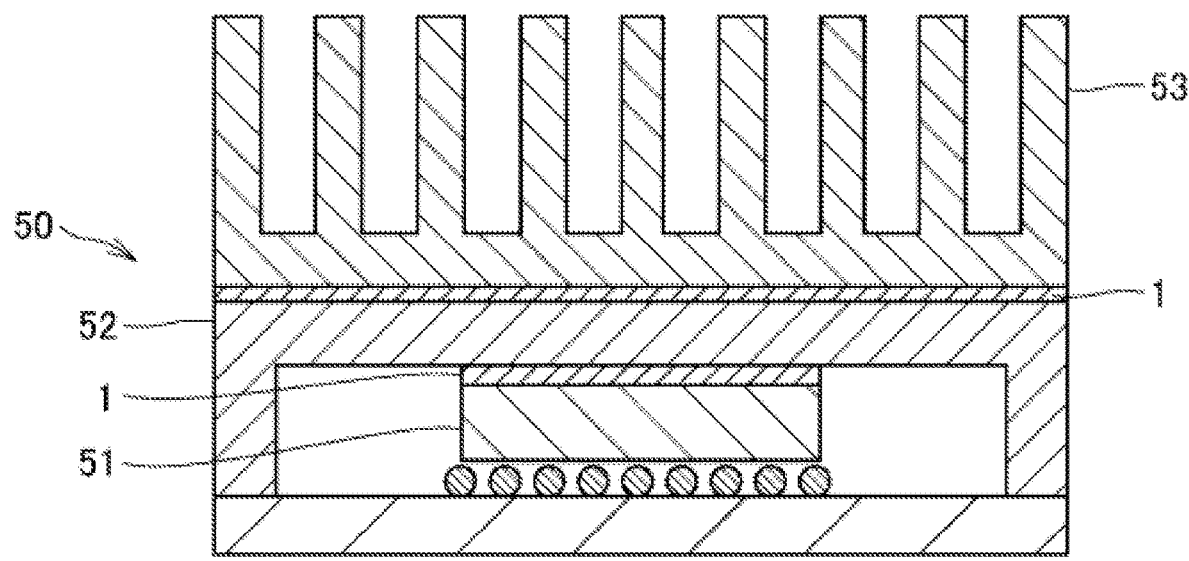
FIG. 4 is a cross-sectional view of an example of a semiconductor device.

For example, as illustrated in FIG. 4, the thermally conductive sheet 1 is mounted on a semiconductor device 50 built into various electronic devices and is sandwiched between a heat source and a heat-dissipating member. The semiconductor device 50 illustrated in FIG. 4 has at least an electronic component 51, a heat spreader 52, and a thermally conductive sheet 1, wherein the thermally conductive sheet 1 is sandwiched between the heat spreader 52 and the electronic component 51. By using the thermally conductive sheet 1, the semiconductor device 50 will have high heat dissipation and will have an excellent electromagnetic wave suppressing effect, depending on the amount of magnetic metal powder in the sheet body 2.

The electronic component 51 is not particular limited and can be selected as appropriate based on the objective, and examples include various semiconductor elements such as a CPU, MPU, graphic computing element, or image sensor; antenna elements; batteries; and the like. The heat spreader 52 is not particularly limited so long as being a member that dissipates the heat emitted by the electronic component 51 and can be appropriately selected based on the objective. The thermally conductive sheet 1 is sandwiched between the heat spreader 52 and the electronic component 51. Furthermore, the thermally conductive sheet 1 forms a heat dissipating member that dissipates the heat of the electronic component 51 with the heat spreader 52 when sandwiched between the heat spreader 52 and a heat sink 53.

The mounting location of the thermally conductive sheet 1 is not limited to being between the heat spreader 52 and the electronic component 51 or between the heat spreader 52 and the heat sink 53 but can of course be selected as appropriate, based on the configuration of the electronic device or semiconductor device. In addition to the heat spreader 52 and the heat sink 53, the heat dissipating member can be any member that conducts the heat generated by the heat source and dissipates that heat outside, such as a radiator, cooler, die pad, printed circuit board, cooling fan, Peltier element, heat pipe, metal cover, housing, and the like.

EXAMPLES

Next, an example of the present technology is described. In this example, a silicone composition (thermally conductive resin composition) was prepared by blending a two-component addition-reaction type liquid silicone with 23% by volume of aluminum nitride particles with an average particle diameter of 1 μm coupling treated with a silane coupling agent, 20% by volume of alumina particles with an average particle diameter of 5 μm, and 22% by volume of pitch-based carbon fibers with an average fiber length of 150 μm as a fibrous filler to prepare a silicone composition (thermally conductive resin composition). The two-component addition-reaction type liquid silicone resin contains an organopolysiloxane as a main component, and is formulated so that the ratio of silicone agent A:silicone agent B is 17.5 vol %:17.5 vol %. The obtained silicone composition was extrusion molded into a hollow square columnar mold (50 mm×50 mm) with a release-treated film applied along the inner wall of the mold to form a 50 mm square silicone molding body, and then heated in an oven at 100° C. for 6 hours to form a silicone cured product (thermally conductive molding body). The silicone cured product was removed from the hollow square columnar mold, the release-treated film was peeled off and cut into sheets using a slicer such that the thickness was 0.5 mm. The molded body sheet obtained by slicing was processed under the conditions of the following examples and comparative examples to obtain a thermally conductive sheet.

The silicone resin layer side was placed on an SUS plate using the self weight of the obtained thermally conductive sheet (50 mm×50 mm×0.5 mm), and then checked three times as to whether or not the sheet falls when inverted 180 degrees. If the sheet does not fall after more than one minute during all three tests, the sheet was evaluated as having tackiness, but if the sheet falls within one minute in all three tests, the sheet was evaluated as not having tackiness. Note that if the sheet did not fall after more than one minute in even one test, the sheet was evaluated as having slight tackiness.

The thermal resistance [° C.·cm$^2$/W] of a thermally conductive sheet cut to an outer diameter of 20 mmΦ was measured under a load of 1 kgf/cm$^2$ by a method conforming to ASTM-D5470.

Example 1

A two-component addition-reaction type liquid silicone was applied to a release PET to obtain a silicone resin film where a silicone resin is laminated to a thickness of 2 μm. The silicone resin film was attached to one surface of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Example 2

A two-component addition-reaction type liquid silicone was applied to a release PET to obtain a silicone resin film where a silicone resin is laminated to a thickness of 5 μm. The silicone resin film was attached to one surface of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Example 3

A two-component addition-reaction type liquid silicone was applied to a release PET to obtain a silicone resin film where a silicone resin is laminated to a thickness of 10 μm. The silicone resin film was attached to one surface of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Example 4

A two-component addition-reaction type liquid silicone was applied to a release PET to obtain a silicone resin film where a silicone resin is laminated to a thickness of 5 μm. The silicone resin film was attached to both surfaces of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Example 5

A two-component addition-reaction type liquid silicone was applied to a release PET to obtain a silicone resin film where a silicone resin is laminated to a thickness of 1 μm. The silicone resin film was attached to one surface of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Comparative Example 1

A thermally conductive sheet made of only a molded body sheet was formed without a silicone resin layer.

Comparative Example 2

A two-component addition-reaction type liquid silicone was applied to a release PET to obtain a silicone resin film where a silicone resin is laminated to a thickness of 20 μm. The silicone resin film was attached to one surface of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

Comparative Example 3

A two-component addition-reaction type liquid silicone was applied to a release PET to obtain a silicone resin film where a silicone resin is laminated to a thickness of 10 The silicone resin film was attached to both surfaces of the molded body sheet obtained by slicing to form a film laminate body. The film laminate body was sandwiched between release-treated PET films and pressed under conditions with pressure of 0.5 MPa, temperature of 87° C., and time of 3 minutes. After pressing, the PET films were peeled off to obtain a thermally conductive sheet having silicone resin film.

TABLE 1

| | Sheet thickness [mm] | Silicone resin thickness [μm] | Silicone film transfer surface [Both surfaces/ One surface] | Thermal resistance [° C. · cm$^2$/W] @1 kgf/cm$^2$ | Thermal resistance increase [° C. · cm$^2$/W] Based on Comparative Example 1 | Tackiness |
|---|---|---|---|---|---|---|
| Example 1 | 0.5 | 2 | One surface | 0.35 | 0 | Tackiness on one surface |
| Example 2 | 0.5 | 5 | One surface | 0.5 | 0.15 | Tackiness on one surface |
| Example 3 | 0.5 | 10 | One surface | 0.75 | 0.4 | Tackiness on one surface |
| Example 4 | 0.5 | 5 | Both surfaces | 0.65 | 0.3 | Tackiness on both surfaces |
| Example 5 | 0.5 | 1 | One surface | 0.3 | −0.05 | Slight tackiness on one surface |
| Comparative Example 1 | 0.5 | 0 | None | 0.35 | — | None |
| Comparative Example 2 | 0.5 | 20 | One surface | 1.25 | 0.9 | Tackiness on one surface |
| Comparative Example 3 | 0.5 | 10 | Both surfaces | 1.15 | 0.8 | Tackiness on both surfaces |

As shown in Table 1, the thermally conductive sheets of Examples 1-5 in which a silicone resin with a thickness or total thickness of 12 μm or less (1-10 μm) was transferred to one or both surfaces of the molded body sheet were able to impart tackiness or slight tackiness, and the increase in thermal resistance was also kept lower with respect to the thermal conductive sheet of Comparative Example 1 where silicone resin was not transferred.

On the other hand, Comparative Example 2, in which the thickness of the silicone resin transferred to one surface of the molded body sheet was 20 μm, and Comparative Example 3, in which the total thickness of the silicone resin transferred to both surfaces of the molded body sheet was 20 μm had increased thermal resistance, and the thermal resistance was significantly increased with reference to Comparative Example 1.

LIST OF REFERENCE NUMERALS

1 Thermally conductive sheet
2 Sheet body
5 Silicone resin layer
6 Thermally conductive molded body
7 Molded body sheet

The invention claimed is:

1. A method for producing a thermally conductive sheet, comprising:
   forming a molded body sheet having thermal conductivity and comprising a fibrous thermally conductive filler;
   forming a silicone resin film by applying a silicone resin to a supporting body;
   affixing at least one surface of the molded body sheet directly to a silicone resin side of the silicone resin film; and
   transferring the silicone resin to the at least one surface of the molded body sheet to form a silicone resin layer on the molded body sheet, the silicone resin layer being to be attached to a heat source or a heat dissipating member;
   wherein the molded body sheet has a change in thermal resistance due to the transferring of the silicone resin of $0.5° C.·cm^2/W$ or less.

2. The method according to claim 1, wherein the silicone resin layer is formed on only one surface of the molded body sheet, and the thickness of the silicone resin layer is 12 μm or less.

3. The method according to claim 1, wherein the silicone resin layer is formed on both surfaces of the molded body sheet, and a total thickness of the silicone resin layer formed on both surfaces of the molded body sheet is 12 μm or less.

4. The method according to claim 1, wherein the silicone resin is transferred to only one surface of the molded body sheet.

5. The method according to claim 4, wherein a surface of the molded body sheet to which the silicone resin is not transferred is non-adhesive.

6. The method according to claim 1, wherein the molded body sheet is formed by:
   molding a thermally conductive resin composition comprising a polymer matrix and the fibrous thermally conductive filler dispersed in the polymer matrix into a predetermined shape;
   curing the molded thermally conductive resin composition to form a thermally conductive molded body; and
   slicing the thermally conductive molded body into a sheet shape.

7. The method according to claim 6, wherein the polymer matrix comprises a liquid silicone.

8. The method according to claim 1, wherein the fibrous thermally conductive filler is a carbon fiber.

9. The method according to claim 1, wherein the molded body sheet comprises a silicone resin, and the silicone resin included in the molded body sheet and the silicone resin which is transferred to the at least one surface of the molded body sheet are the same.

* * * * *